US006784065B1

(12) United States Patent
Naem

(10) Patent No.: US 6,784,065 B1
(45) Date of Patent: Aug. 31, 2004

(54) BIPOLAR TRANSISTOR WITH ULTRA SMALL SELF-ALIGNED POLYSILICON EMITTER AND METHOD OF FORMING THE TRANSISTOR

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/882,915

(22) Filed: Jun. 15, 2001

(51) Int. Cl.$^7$ ............................................. H01L 21/331
(52) U.S. Cl. ...................... 438/366; 438/345; 438/327; 438/343; 438/325; 438/364; 438/236; 438/204; 438/207
(58) Field of Search ................................. 438/366, 345, 438/327, 343, 325, 364, 236, 207, 204

(56) References Cited

U.S. PATENT DOCUMENTS

| | | | |
|---|---|---|---|
| 4,564,997 A | 1/1986 | Matsuo et al. | ............ 29/576 W |
| 5,077,227 A | 12/1991 | Kameyama et al. | .......... 437/31 |
| 5,187,554 A | 2/1993 | Miwa | .......................... 307/586 |
| 5,320,972 A | 6/1994 | Wylie | .......................... 437/31 |
| 5,323,032 A | 6/1994 | Sato et al. | .................... 257/198 |
| 5,362,669 A | 11/1994 | Boyd et al. | .................... 437/67 |
| 5,508,213 A | 4/1996 | Van Der Wel et al. | ........ 437/31 |
| 5,557,131 A * | 9/1996 | Lee | .............................. 257/370 |
| 5,648,280 A | 7/1997 | Kato | ............................ 437/31 |
| 5,897,359 A | 4/1999 | Cho et al. | .................... 438/312 |
| 6,171,936 B1 | 1/2001 | Fitzgerald | .................... 438/503 |
| 6,235,601 B1 * | 5/2001 | Kim | ............................ 438/348 |
| 6,333,235 B1 | 12/2001 | Lee et al. | .................... 438/309 |
| 6,337,251 B1 | 1/2002 | Hashimoto | .................... 438/309 |
| 6,352,907 B1 | 3/2002 | Gris | ............................. 438/438 |
| 6,426,265 B1 | 7/2002 | Chu et al. | .................... 438/312 |
| 6,468,871 B1 * | 10/2002 | Naem | .......................... 438/378 |
| 6,528,861 B1 | 3/2003 | Naem | .......................... 257/565 |

FOREIGN PATENT DOCUMENTS

| | | | | |
|---|---|---|---|---|
| EP | 0779663 A2 | 6/1997 | ......... | H01L/29/732 |
| JP | 02260430 A | 10/1990 | ......... | H01L/21/331 |
| JP | 04082268 A | 3/1992 | ........... | H01L/27/14 |
| JP | 06318602 A | 11/1994 | ......... | H01L/21/331 |

OTHER PUBLICATIONS

Asanga H. Perera, William J. Taylor, Marius Orlowski, "Influence of Back–End Thermal Processing on Polysilicon–Monosilicon Contact Resistance Due to Dopant Deactivation, Proc. of the Bipolar/BiCMOS Circuits & Technology," (1994), pp. 242–245.*

M. Racanelli, W.M. Huang, S. Kuehne, J. Foerstner, S. Wong, and B.Y. Hwang, "Contact Technology for High Performance Scalable BiCMOS on TFSOI," IEEE Electr. Device Lett., vol. 16, No. 10, (1995), pp. 424–426.*

Wim van der Wel et al., Ronald Koster, Sander Jensen, Ed Bladt, Fred Hurkx, and Peter Baltus, "Poly–Ridge Emitter Transistor (PRET) : Simple Low Power Option to a Bipolar Process," IEDM, (1993) pps. 17.6.1–17.6.4.*

C.A. King et al., "Very Low Cost Graded SiGe Base Bipolar Transistors for a High–Performance Modular BiCMOS Process", IEDM, 1999, pp. 565–568.

Wim van der Wel., "Poly–Ridge Emitter Transistor (PRET): Simple Low–Power Option to a Bipolar Process", IEDM, 1993, pp. 453–456.

IBM Technical Disclosure Bulletin, "Epi–Based Bipolar Transistor With Oxide–Defined Collector Window", vol. 34, No. 1, Jun. 1991, pp. 422–424.

* cited by examiner

*Primary Examiner*—Eddie Lee
*Assistant Examiner*—Thomas Magee
(74) *Attorney, Agent, or Firm*—Mark C. Pickering

(57) ABSTRACT

A low-power bipolar transistor is formed to have an intrinsic emitter region with a sub-lithographic width, and an oxide layer that is self aligned to an overlying extrinsic emitter. The small extrinsic emitter region reduces the maximum current that can flow through the transistor, while the self-aligned oxide layer and extrinsic emitter reduces the base-to-emitter junction size and device performance variability across the wafer.

27 Claims, 4 Drawing Sheets

BIPOLAR TRANSISTOR WITH ULTRA SMALL SELF-ALIGNED POLYSILICON EMITTER AND METHOD OF FORMING THE TRANSISTOR

RELATED APPLICATION

The present invention is related to application Ser. No. 09/882,740 for "Bipolar Transistor with a Silicon Germanium Base and an Ultra Small Self-Aligned Polysilicon Emitter and Method of Forming the Transistor" by Abdalla Aly Naem filed on an even date herewith

BACKGROUND OF THE INVENTION

1. Field of the Invention

The present invention relates to a bipolar transistor and, more particularly, to a bipolar transistor with an ultra-small, self-aligned polysilicon emitter and a method of forming the transistor.

2. Description of the Related Art

A bipolar transistor is a three-terminal device that can, when properly biased, controllably vary the magnitude of the current that flows between two of the terminals. The three terminals include a base terminal, a collector terminal, and an emitter terminal. The charge carriers, which form the current, flow between the collector and the emitter terminals, while variations in the voltage on the base terminal cause the magnitude of the current to vary.

Due to the increasing demand for battery-powered devices, there is a need for a bipolar transistor that utilizes less power. Lower power consumption can be obtained by reducing the maximum current that can flow between the two terminals. One approach for reducing the maximum current is to reduce the size of the base-to-emitter junction, preferably to sub-lithographic feature sizes.

FIG. 1 shows a cross-sectional diagram that illustrates a portion of a prior-art bipolar transistor 100 that has a base-to-emitter junction with a sub-lithographic width. As shown in FIG. 1, transistor 100 includes a collector layer 110, a base layer 112 that is formed on collector layer 110, and a field oxide region FOX that adjoins layer 112. In addition, transistor 100 includes a thin oxide layer 114 that is formed on a portion of base layer 112 and the field oxide region FOX, and an n+ extrinsic emitter 116 that is formed on thin oxide layer 114.

As further shown in FIG. 1, transistor 100 also includes an n+ intrinsic emitter region 118 that is formed in base layer 112, and an n+ poly ridge 120 that is connected to extrinsic emitter 116 and n+ intrinsic emitter region 118. Extrinsic emitter 116, intrinsic emitter region 118, and poly ridge 120 form the emitter of transistor 100.

Transistor 100 additionally includes a base silicide contact 122 that is formed on base layer 112, and an emitter silicide contact 124 that is formed on extrinsic emitter 116. In addition, an oxide spacer 126 is formed on base layer 112 between poly ridge 120 and base contact 122.

During fabrication, poly ridge 120 is formed to have a maximum width (measured laterally) that is smaller than the minimum feature size that is obtainable with a given photolithographic process. After poly ridge 120 has been formed, emitter region 118 is formed during an annealing step which causes dopants to outdiffuse from poly ridge 120 into base layer 112.

As a result, a very small base-to-emitter junction results. A small base-to-emitter junction limits the magnitude of the current that can flow through transistor 100. Reduced current, in turn, provides lowpower operation. (See "Poly Emitter Transistor (PRET): Simple Low Power Option to a Bipolar Process," Wim van der Wel, et al., IEDM 93-453, 1993, pp. 17.6.1-17.6.4.)

One drawback of transistor 100, however, is that transistor 100 requires the added cost and complexity of a double polysilicon process (extrinsic emitter 116 is formed from a first polysilicon (poly-1) layer, while poly ridge 120 is formed from a second polysilicon (poly-2) layer). In addition, emitter dopant diffusion into base 112 can be less, compared to a conventional single-poly device architecture, due to the possible presence of oxide at the poly1-to-poly2 interface (emitter 116 to poly ridge 120 interface).

Another drawback of transistor 100 is that, although FIG. 1 shows oxide spacer 126 formed on poly ridge 120, in actual practice it is difficult to form an oxide side-wall spacer on a sloped surface. Gaps can result which, in turn, can lead to an electrical short circuit between base layer 112 and extrinsic emitter 116 following the salicidiation process (the process that forms base silicide contact 122 and emitter silicide contact 124). Silicide is not formed on oxide. Thus it is critical that a uniformly thick layer of oxide (spacer 126) separate base layer 112 from extrinsic emitter 116.

A further drawback of transistor 100 is that the slope of the end wall of extrinsic emitter 116 can effect the width of poly ridge 120. Although FIG. 1 shows extrinsic emitter 116 with a vertical end wall, in actual practice, the end wall is often non-vertical, and non-uniform across a wafer that has a number of bipolar transistors. This, in turn, can result in the bipolar transistors having varying performances.

An additional drawback of transistor 100 is that poly ridge 120 is formed around and in contact with each side wall of extrinsic emitter 116. A plan view of extrinsic emitter 116 would show emitter 116 with a square or rectangular shape with poly ridge 120 surrounding emitter 116. As a result, transistor 100 has a large base-to-emitter contact area and a high base-to-emitter capacitance.

Thus, there is a need for a low-power bipolar transistor with a sub-lithographic base-to-emitter junction that reduces, or preferably eliminates, the previously-described drawbacks.

SUMMARY OF THE INVENTION

The present invention provides a bipolar transistor that is formed with a single polysilicon process, and has a substantially vertical end wall. The vertical end wall allows a standard oxide side-wall spacer to be formed adjacent to the extrinsic emitter, thereby reducing the likelihood of any base-to-emitter short circuits.

In addition, the present invention forms a sub-lithographic emitter region that reduces the maximum current that can flow through the transistor, thereby reducing power consumption. The present invention also reduces the base-to-emitter capacitance by limiting the base-to-emitter contact area.

The bipolar transistor of the present invention is formed on a wafer that has a buried layer, an epitaxial layer of a first conductivity type that is formed over the buried layer, and an intrinsic base region of a second conductivity type that is formed in the epitaxial layer. The epitaxial layer has a smaller dopant concentration than the buried layer.

The bipolar transistor has an isolation region that formed on the surface of the intrinsic base region. The isolation region has a side wall. The transistor also has an extrinsic emitter region that is formed on the isolation region and the intrinsic base region. The extrinsic emitter region has a side wall. In accordance with the present invention, the side wall of the extrinsic emitter region is substantially aligned with the side wall of the isolation region. In addition, the region of the extrinsic emitter that contacts the intrinsic base has a sub-lithographic feature size.

The bipolar transistor further has an intrinsic emitter region that is formed in the intrinsic base region. The intrinsic emitter region contacts the extrinsic emitter region. The transistor additionally has an isolation spacer that is formed on the intrinsic base region to contact the extrinsic emitter.

The present invention also includes a method for forming a low-power bipolar transistor. The bipolar transistor is formed on a wafer that has a buried layer, an epitaxial layer of a first conductivity type that is formed over the buried layer, and an intrinsic base region of a second conductivity type that is formed in the epitaxial layer. The epitaxial layer has a smaller dopant concentration than the buried layer.

The method of the present invention begins by forming an isolation region on the intrinsic base region. The method includes the steps of forming a layer of conductive material on the isolation region and the intrinsic base region, and etching the layer of conductive material to form an extrinsic emitter on the isolation region and the intrinsic base region.

The method further includes the step of etching the isolation region such that a side wall of the extrinsic emitter and a side wall of the isolation region are substantially aligned. The method additionally includes the steps of forming an intrinsic emitter region in the intrinsic base region, and forming a side-wall spacer on the intrinsic base region to adjoin the extrinsic emitter.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
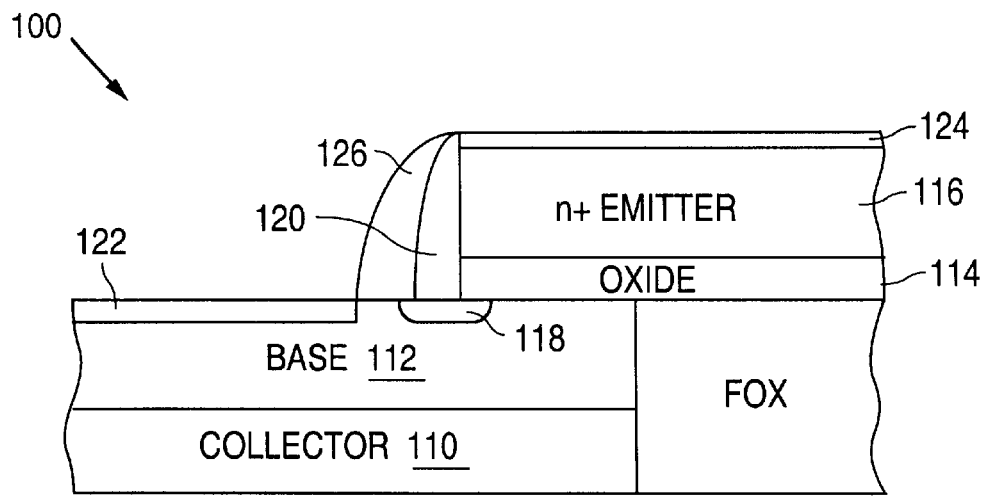
FIG. 1 is a ross-sectional diagram illustrating a portion of a prior-art bipolar transistor 100 that has a base-to-emitter junction with a sub-lithographic width.
Figure 2:
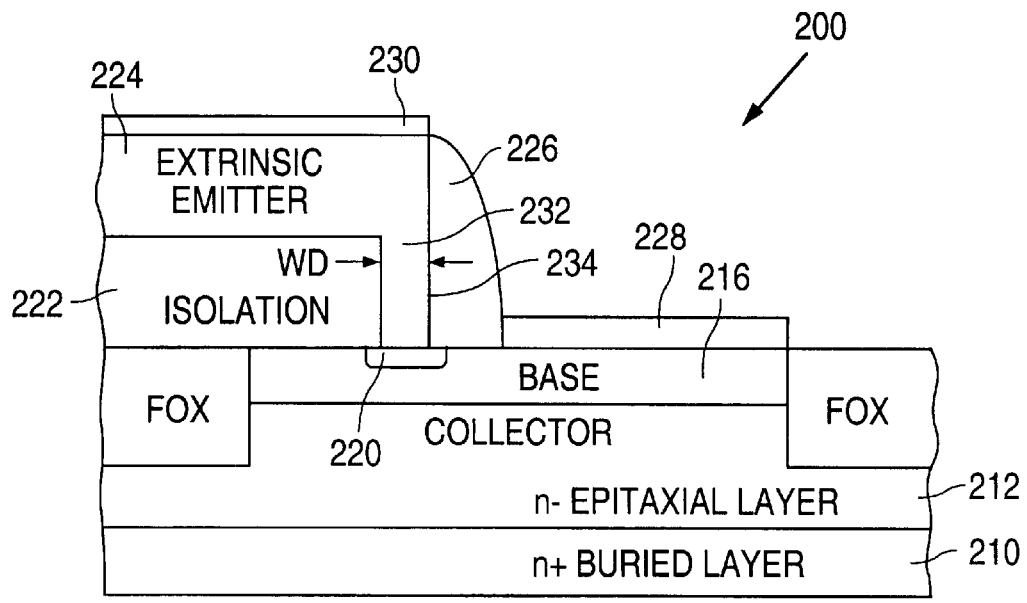
FIG. 2 a cross-sectional view illustrating a portion of a lowpower biplar transistor 200 in accordance with the present invention.

FIG. 2 is a cross-sectional view that illustrates a portion of a low-power bipolar transistor 200 in accordance with the present invention. As shown in FIG. 2, transistor 200 is formed on a wafer that has an n+ buried layer 210, an n– epitaxial layer 212 that is formed over n+ buried layer 210, and a field oxide region FOX that adjoins layer 212. N+ buried layer 210 and n– epitaxial layer 212 form the collector of transistor 200.

As further shown in FIG. 2, transistor 200 includes a p– intrinsic base 216 that is formed in n– epitaxial layer 212. In addition, transistor 200 includes an n+ intrinsic emitter region 220 that is formed in p– intrinsic base 216, and a layer of isolation material 222 that is formed on intrinsic base 216 and the field oxide region FOX.

Transistor 200 further includes an extrinsic emitter 224 that is formed on isolation layer 222, and an oxide spacer 226 that is formed on base 216 adjacent to extrinsic emitter 224. Transistor 200 also includes a base silicide layer 228 that is formed on base 216, and an emitter silicide layer 230 that is formed on extrinsic emitter 224.

As described in greater detail below, isolation layer 222 and extrinsic emitter 224 in the present invention are formed to have substantially aligned side walls (in the plane parallel to the page). Further, the method of the present invention forms extrinsic emitter 224 such that an end region 232 of emitter 224 has a width WD that is less than the minimum feature size that can be obtained from the photolithographic process used to form the wafer. This allows intrinsic emitter region 220 to be very small which, in turn, reduces the size of the base-to-emitter junction.

In addition, extrinsic emitter 224 is formed to have a vertical end wall 234. The advantage of vertical end wall 234 is that a conventional (full height and width) oxide side-wall spacer can then be formed next to vertical end wall 234, thereby providing the necessary base-to-emitter isolation. In addition, vertical end wall 234 minimizes the variability of width WD.

Figure 3A:
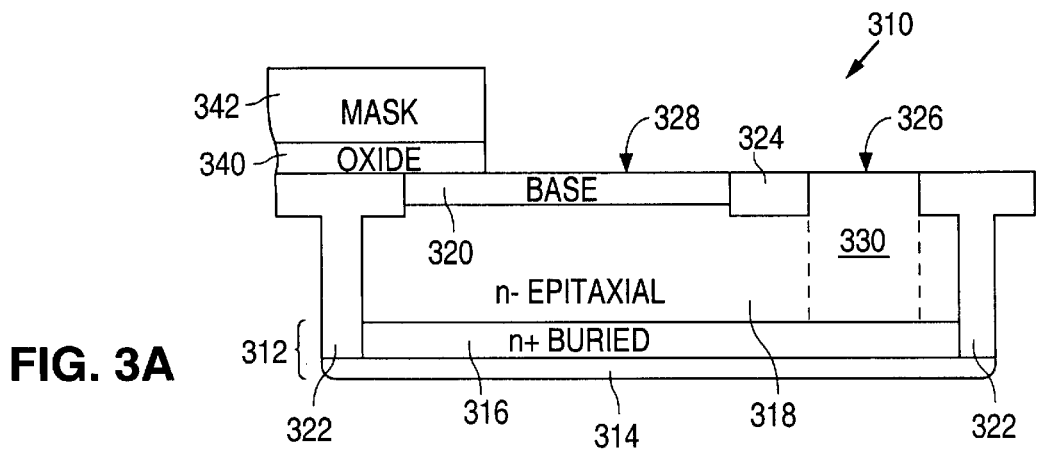
FIGS. 3A–3G cross-sectional drawings illustrating a method of forming a bipolar transistor in accordance with the present invention.

FIGS. 3A–3G are cross-sectional views that illustrate a method of forming bipolar transistor 200 in accordance with the present invention. As shown in FIG. 3A, the method utilizes a conventionally-formed wafer 310 that has a semiconductor layer 312. Semiconductor layer 312, in turn, has a substrate layer 314, such as silicon or oxide, and an n+ buried layer 316. In addition, wafer 310 also has a lightly-doped, n-type epitaxial layer 318 that is formed on n+ buried layer 316, and a p-type intrinsic base 320 that is formed in layer 318.

Wafer 310 further has a deep trench isolation region 322 that isolates epitaxial layer 318 from laterally adjacent regions. A shallow trench isolation region 324 is also formed in epitaxial layer 318. The shallow trench isolation region 324 separates a collector surface area 326 from a base surface area 328 of the to-be-formed bipolar transistor.

In addition, wafer 310 can optionally include an n+ diffused contact region 330 that extends down from collector surface area 326 in epitaxial layer 318 to contact n+ buried layer 316. Contact region 330 is utilized to reduce the series resistance to buried layer 316. N+ buried layer 316, n– epitaxial layer 318, and optional n+ diffused contact region 330 define the collector of the to-be-formed bipolar transistor.

As shown in FIG. 3A, the method of the present invention begins by depositing a layer of oxide 340, for example, 1000Å thick, on the surface of intrinsic base 320. Following this, an oxide definition mask 342 is formed and patterned on oxide layer 340. Once mask 342 has been patterned, the exposed regions of oxide layer 340 are etched away to expose the surface of intrinsic base 320. Mask 342 is then stripped.

Figure 3B:
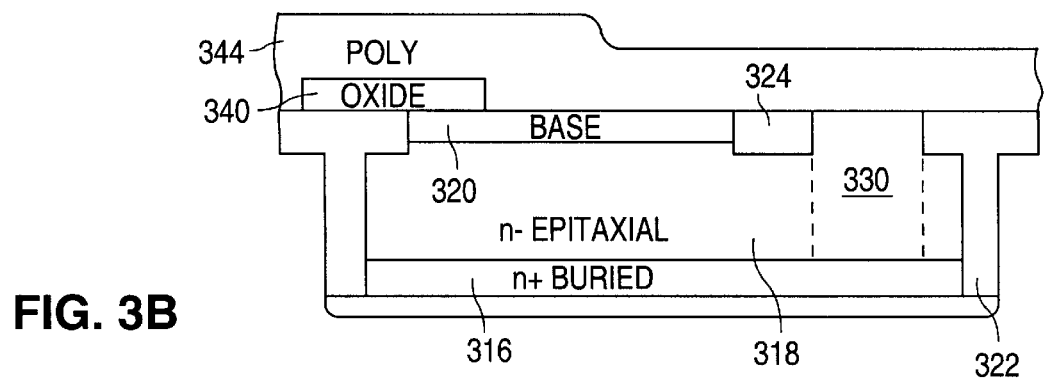

Next, as shown in FIG. 3B, a layer of polysilicon (poly) 344, for example, 2000 Å thick, is deposited on intrinsic base 320 and oxide layer 340. Poly layer 344 is conventionally doped with phosphorous or arsenic, such as by ion implantation, to have a high (n+) dopant concentration.

Figure 3C:
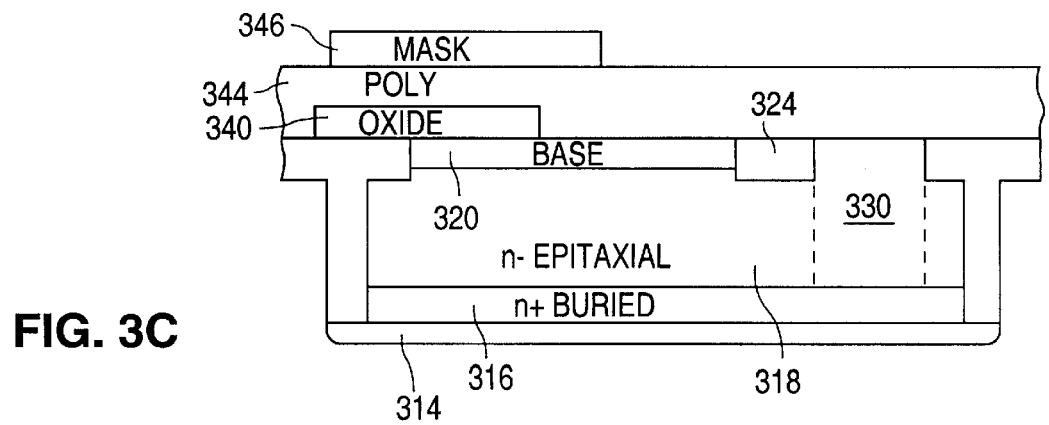

As shown in FIG. 3C, after poly layer 344 has been doped, poly layer 344 is planarized using a conventional approach, such as chemical-mechanical-polishing, to have a single-level top surface. Following this, a poly-etch mask 346 is formed and patterned on poly layer 344. Mask 346 is patterned to define the width (width WD in FIG. 2) of an end region of the to-be-formed extrinsic emitter.

Figure 3D:
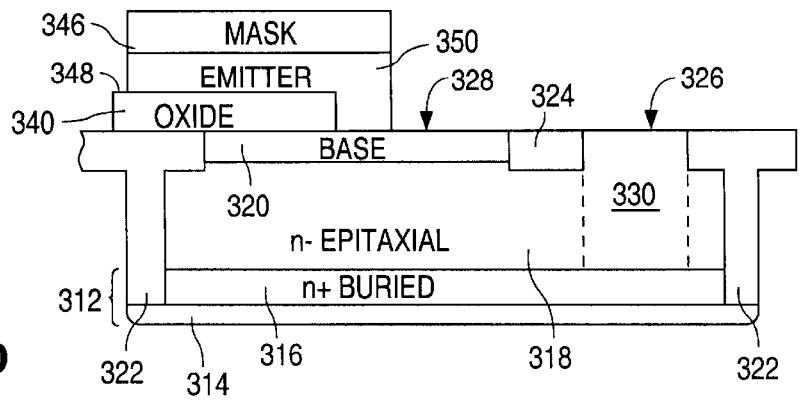

As shown in FIG. 3D, once mask 346 has been patterned, the exposed regions of poly layer 344 are etched away to expose the top surface of intrinsic base 328 expose a top surface 348 of oxide layer 340, and form an extrinsic emitter 350. The etch is a timed etch, and care must be exercised to insure that the surface of intrinsic base 320 is not overetched.

Figure 4:
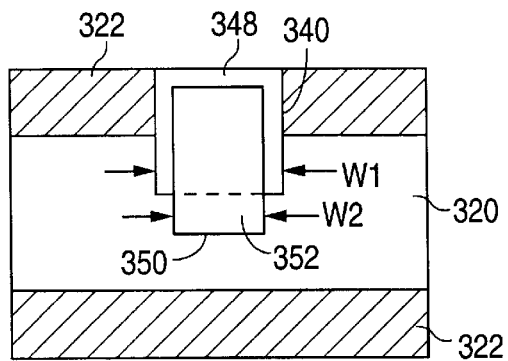
FIG. 4 is a plan view illustrating top surface 348 of oxide layer 340 following the etch of poly layer 344 in accordance with the present invention.

FIG. 4 shows a plan view that illustrates top surface 348 of oxide layer 340 following the etch of poly layer 344 in accordance with the present invention. As shown in FIG. 4, oxide layer 340 has a width W1 that is wider than a width W2 of extrinsic emitter 350. Width W1 is larger than width W2 to accommodate misalignment error and insure that only an end region 352 of extrinsic emitter 350 contacts intrinsic base 320.

Figure 5:
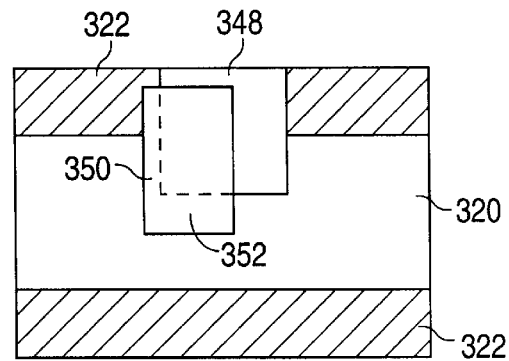
FIG. 5 is a plan view illustrating top surface 348 of oxide layer 340 following a misaligned etch of poly layer 344 when widths W1 and W2 are initially formed to be the same.

FIG. 5 shows a plan view that illustrates top surface 348 of oxide layer 340 following a misaligned etch of poly layer 344 when widths W1 and W2 are initially formed to be the same. As shown in FIG. 5, the area of top surface 348 is greater than the area of top surface 348 shown in FIG. 4 because one side of extrinsic emitter 350 is off of oxide layer 340 and in contact with p– intrinsic base 320. If more than the end region 352 of extrinsic emitter 350 is formed on base 320, then device performance can be significantly altered. This type of misalignment can vary across the wafer causing device performance variability.

In accordance with the present invention, after poly layer 344 has been etched, top surface 348 and the underlying regions of oxide layer 340 are selectively removed with a wet etch. The etch self-aligns oxide layer 340 to the overlying extrinsic emitter 350. To avoid further etching of the top surface of intrinsic base 320, an etchant with a very high selectivity for silicon should be utilized.

Figure 6:
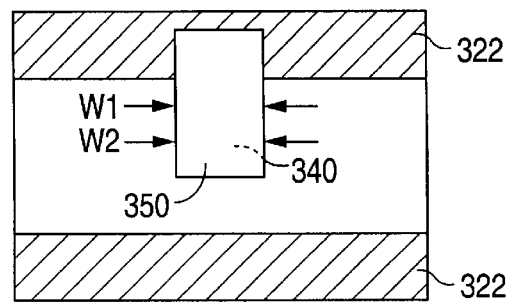
FIG. 6 is a plan view illustrating extrinsic emitter 350 following the etch of oxide layer 340 in accordance with the present invention.

FIG. 6 shows a plan view that illustrates extrinsic emitter 350 following the etch of oxide layer 340 in accordance with the present invention. As shown in FIG. 6, in the present invention, width W1 and width W2 are substantially the same. By reducing the width W1 to be substantially equal to the width W2, the base-to-emitter contact area is substantially reduced which, in turn, reduces the base-to-emitter capacitance.

Figure 3E:
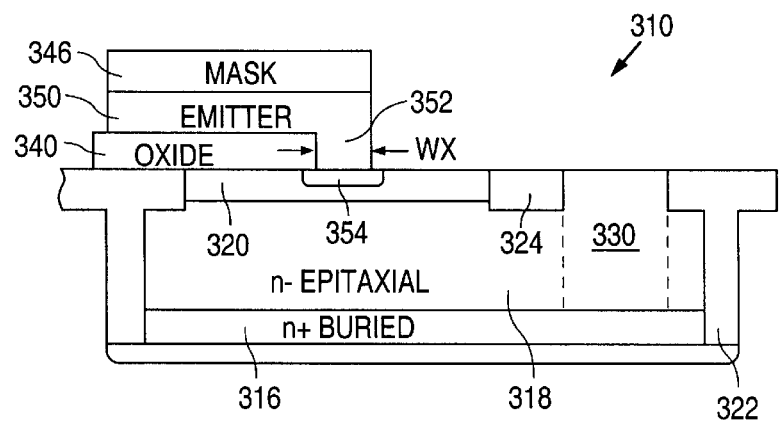

Next, as shown in FIG. 3E, wafer 310 is subject to rapid thermal annealing (RTA). During the RTA process, dopants from n+ extrinsic emitter 350 diffuse into p– intrinsic base 320 to form an n+ intrinsic emitter region 354 in intrinsic base 320. Following this, mask 346 is stripped.

One of the advantages of the present invention is that end region 352 can be formed to have a sub-lithographic width WX. As a result, intrinsic emitter region 354 can also be formed to have a smaller size. The smaller size of intrinsic emitter region 354, in turn, reduces the magnitude of the current that can flow through the bipolar transistor, thereby reducing the power consumption.

Figure 3F:
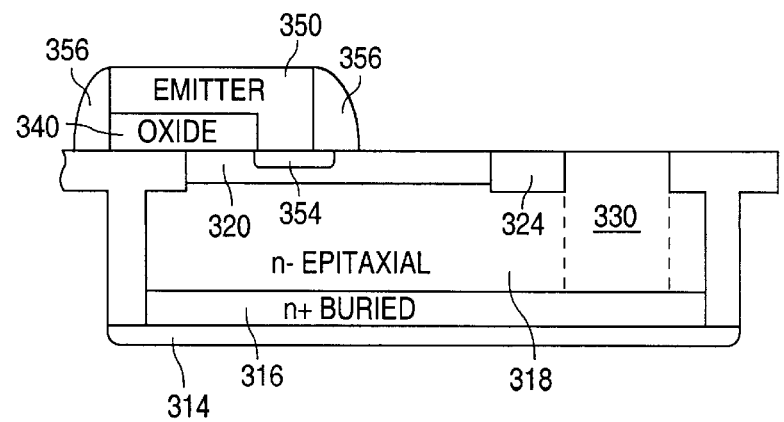

As shown in FIG. 3F, once the RTA process has been completed, a layer of isolation material, such as oxide, approximately 4000 Å thick is formed on intrinsic base 320 and extrinsic emitter 350. The layer of isolation material is then anisotropically etched to form isolation sidewall spacers 356.

Figure 3G:
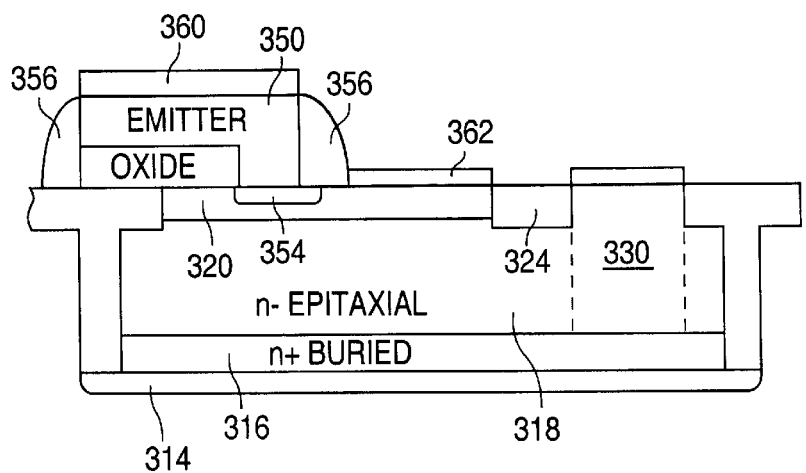

Following this, as shown in FIG. 3G, a layer of metal is formed over intrinsic base 320, extrinsic emitter 350, and spacers 356. The layer of metal is then reacted (heated) to form an emitter silicide layer 360 and a base silicided layer 362. (Silicon is consumed when layers 360 and 362 are formed by direct reaction.) The metal does not react with the material used to form spacers 356, and is subsequently removed. The method then continues with conventional steps.

Thus, a method for forming a bipolar transistor in accordance with the present invention has been described. The present method reduces the base-to-emitter contact area, and thereby the base-to-emitter capacitance, by forming oxide layer 340 to be self-aligned with extrinsic emitter 350. In addition, the present method reduces the maximum current, and thereby the power, that is consumed by the bipolar transistor by forming a small intrinsic emitter region.

Another one of the advantages of the present invention is that transistor 200 is formed with a single polysilicon fabrication process. This is much less expensive and complex than a double polysilicon process. Further, since the poly-1 to poly-2 interface has been eliminated, dopant diffusion is enhanced during the RTA step.

It should be understood that various alternatives to the method of the invention described herein may be employed in practicing the invention. For example, although the method is described with respect to npn transistors, the method applies equally well to pnp transistors where the conductivity types are reversed.

In addition, the present method can be incorporated into a BiCMOS process. Thus, it is intended that the following claims define the scope of the invention and that methods and structures within the scope of these claims and their equivalents be covered thereby.

What is claimed is:

1. A method for forming a bipolar transistor on a wafer, the wafer having a buried layer, an epitaxial layer of a first conductivity type formed over the buried layer and having a smaller dopant concentration than the buried layer, and an intrinsic base region of a second conductivity type formed in the epitaxial layer, the method comprising the steps of:

forming an isolation region on the intrinsic base region;

forming a layer of conductive material on the isolation region and the intrinsic base region;

etching the layer of conductive material to form an extrinsic emitter on the isolation region and the intrinsic base region;

forming an intrinsic emitter region in the intrinsic base region; and forming a side-wall spacer on the intrinsic base region to adjoin the extrinsic emitter.

2. The method of claim 1 wherein the step of forming the isolation region on the intrinsic base region includes the steps of:

forming a layer of isolation material on the intrinsic base region; and etching the layer of isolation material to form the isolation region.

3. The method of claim 1 and further comprising the step of planarizing the layer of conductive material prior to the step of etching the layer of conductive material.

4. The method of claim 3 wherein the step of planarizing the layer of conductive material is performed by chemical-mechanical-polishing.

5. The method of claim 1 wherein the step of etching the layer of conductive material is a timed etch.

6. The method of claim 1 wherein the extrinsic emitter has a region that contacts the intrinsic base.

7. The method of claim 6 and further comprising the step of etching the isolation region such that a side wall of the extrinsic emitter and a side wall of the isolation region are substantially aligned, wherein the isolation region has a substantially vertical end wall, the end wall lying in a plane that is unparallel with a plane that includes substantially all of the side wall of the extrinsic emitter.

8. The method of claim 1 wherein a top surface area of the extrinsic emitter is less greater than a top surface area of the isolation region.

9. The method of claim 8 and further comprising the step of etching the isolation region such that a side wall of the extrinsic emitter and a side wall of the isolation region are substantially aligned, wherein a width of the extrinsic emitter is less than a width of the isolation region, the width of the extrinsic emitter and the width of the isolation region being measured along a line substantially perpendicular to a plane that includes substantially all of the side wall of the extrinsic emitter.

10. The method of claim 1 wherein the step of etching the isolation region is a wet etch with an etchant that etches more oxide than silicon.

11. The method of claim 1 wherein the layer of conductive material is polysilicon.

12. The method of claim 11 wherein the layer of conductive material is doped to have the first conductivity type.

13. The method of claim 1 wherein the step of forming an intrinsic emitter region includes the step of annealing the wafer to cause dopants to outdiffuse from the extrinsic emitter into the intrinsic base region.

14. The method of claim 1 wherein a top surface of the extrinsic emitter substantially lies in a plane, and a portion of the side-wall spacer lies in the plane.

15. The method of claim 1 and further comprising the step of forming a base silicide layer on the intrinsic base region and an emitter silicide layer on the extrinsic emitter.

16. The method of claim 1 wherein the step of forming the base silicide layer includes the steps of:

depositing a layer of metal on the extrinsic emitter, the side-wall spacer, and the intrinsic base region; and heating the layer of metal to form the base silicide layer and the emitter silicide layer.

17. The method of claim 1 wherein the side wall spacer is spaced apart from the isolation region.

18. The method of claim 17 wherein the wafer has a region of field isolation that contacts the instrinsic base region.

19. The method of claim 1 wherein the wafer has a region of field isolation that contacts the instrinsic base region.

20. A method for forming a bipolar transistor on a wafer, the wafer having a substrate, an epitaxial layer of a first conductivity type formed over the substrate, and a base region of a second conductivity type formed in the epitaxial layer, the base region having a top surface, the method comprising the steps of:

forming an isolation region, the isolation region contacting the top surface of base region;

forming a layer of conductive material on the isolation region and the base region;

etching the layer of conductive material to form an emitter, the emitter contacting the base region of the epitaxial layer, and having the first conductivity type; and forming a side wall spacer on the base region to contact the emitter.

21. The method of claim 20 and further comprising the step of etching the isolation region such that a first side wall of the emitter and a first side wall of the isolation region lie substantially in a same vertical plane.

22. The method of claim 21 wherein when the isolation region is etched, a second side wall of the emitter and a second side wall of the isolation region lie substantially in a same vertical plane.

23. The method of claim 22 wherein the first and second side walls of the isolation region are non-parallel.

24. The method of claim 20 wherein a top surface area of the extrinsic emitter is greater than a top surface area of the isolation region.

25. The method of claim 20 wherein the layer of conductive material is polysilicon.

26. The method of claim 20 wherein the side wall spacer is spaced apart from the isolation region.

27. The method of claim 20 wherein the wafer has a region of field isolation that contacts the base region.

* * * * *

UNITED STATES PATENT AND TRADEMARK OFFICE
CERTIFICATE OF CORRECTION

PATENT NO. : 6,784,065 B1
DATED : August 31, 2004
INVENTOR(S) : Naem

It is certified that error appears in the above-identified patent and that said Letters Patent is hereby corrected as shown below:

Column 2,
Line 1, delete "lowpower" and replace with -- low-power --.

Column 3,
Line 41, delete "ross-sectional" and replace with -- cross-sectional --.
Line 45, after "FIG. 2" insert -- is --.
Line 46, delete "lowpower" and replace with -- low-power --.
Line 46, delete "biplar" and replace with --bipolar --.
Line 48, after "FIGS. 3A-3G" insert -- are --.

Column 5,
Line 13, delete "328" and replace with -- 320 --.

Column 6,
Line 2, delete "sidewall" and replace with -- side-wall --.

Column 7,
Line 41, delete "1" and replace with -- 15 --.

Signed and Sealed this

Twenty-sixth Day of October, 2004

JON W. DUDAS
*Director of the United States Patent and Trademark Office*